(12) United States Patent
Lee et al.

(10) Patent No.: US 7,842,333 B2
(45) Date of Patent: Nov. 30, 2010

(54) METHOD OF FORMING PHOSPHOR FILM AND METHOD OF MANUFACTURING LIGHT EMITTING DIODE PACKAGE INCORPORATING THE SAME

(75) Inventors: Hai Sung Lee, Kyungki-do (KR); Jong Myeon Lee, Kyungki-do (KR); Ho Sung Choo, Kyungki-do (KR); Myung Whun Chang, Seoul (KR); Youn Gon Park, Kyungki-do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 1086 days.

(21) Appl. No.: 11/524,952

(22) Filed: Sep. 22, 2006

(65) Prior Publication Data
US 2007/0148332 A1   Jun. 28, 2007

(30) Foreign Application Priority Data
Dec. 27, 2005   (KR) .................. 10-2005-0130153

(51) Int. Cl.
*B05D 5/06* (2006.01)
*B05D 1/12* (2006.01)
*B05D 7/00* (2006.01)

(52) U.S. Cl. .................. 427/71; 427/180; 427/212; 427/215; 427/220

(58) Field of Classification Search .................. 427/71, 427/201–203, 215, 220, 180, 212
See application file for complete search history.

(56) References Cited

U.S. PATENT DOCUMENTS

| | | | |
|---|---|---|---|
| 2001/0004112 A1* | 6/2001 | Furukawa et al. ............... 257/7 |
| 2001/0050371 A1* | 12/2001 | Odaki et al. .................. 257/98 |
| 2002/0097363 A1* | 7/2002 | Yudasaka .................... 349/138 |
| 2004/0104391 A1 | 6/2004 | Maeda et al. |
| 2006/0001352 A1* | 1/2006 | Maruta et al. ............... 313/486 |
| 2006/0078734 A1 | 4/2006 | Braune et al. |

FOREIGN PATENT DOCUMENTS

JP    54-143442    11/1979

(Continued)

OTHER PUBLICATIONS

Japanese Office Action, w/ English translation thereof, issued in Japanese Patent Application No. JP 2006-254853 dated Jul. 20, 2010.

*Primary Examiner*—Timothy H Meeks
*Assistant Examiner*—James Lin
(74) *Attorney, Agent, or Firm*—McDermott Will & Emery LLP

(57) ABSTRACT

The invention relates to a method of forming a phosphor film and a method of manufacturing an LED package incorporating the same. The method of forming a phosphor film includes mixing phosphor and light-transmitting beads in an aqueous solvent such that the nano-sized light-transmitting beads having a first charge are adsorbed onto surfaces of phosphor particles having a second charge. The method also includes coating a phosphor mixture obtained from the mixing step on an area where the phosphor film is to be formed, and drying the coated phosphor mixture to form the phosphor film. The invention further provides a method of manufacturing an LED package incorporating the method of forming the phosphor film.

17 Claims, 4 Drawing Sheets

FOREIGN PATENT DOCUMENTS

| | | |
|---|---|---|
| JP | 09-241630 | 9/1997 |
| JP | 09-288009 | 11/1997 |
| JP | 2002-188085 | 7/2002 |
| JP | 2003-243727 | 8/2003 |
| JP | 2004-161806 | 6/2004 |
| JP | 2004-161807 | 6/2004 |
| WO | WO 03/021691 A1 | 3/2003 |
| WO | WO 2004/042834 * | 5/2004 |
| WO | WO 2004/074400 A1 | 9/2004 |

* cited by examiner (a) (b)

METHOD OF FORMING PHOSPHOR FILM AND METHOD OF MANUFACTURING LIGHT EMITTING DIODE PACKAGE INCORPORATING THE SAME

CLAIM OF PRIORITY

This application claims the benefit of Korean Patent Application No. 2005-130153 filed on Dec. 27, 2005, in the Korean Intellectual Property Office, the disclosure of which is incorporated herein by reference.

BACKGROUND OF THE INVENTION

1. Field of the Invention

The present invention relates to a method of forming a phosphor film, and more particularly, to a wavelength-convertible light emitting diode (LED) package which adjusts the direction of photons scattered by phosphor particles to improve light extraction efficiency.

2. Description of the Related Art

In general, phosphor for excitation of light is extensively used for converting a peculiar wavelength of light emitted from a light source such as a light emitting diode (LED) to a wavelength of other desired color of light. In order to manufacture such an LED package capable of converting the wavelength, for example, a resin part with phosphor dispersed therein can be formed to encapsulate an LED chip or a phosphor film can be formed on a surface of an LED chip.

In case of an LED package adopting a resin part with phosphor dispersed therein, excitation-wavelength light passes through the phosphors in the resin part numerous times, thus leading to low efficiency due to the refraction and reflection by the phosphor. In comparison, in case of an LED package with a phosphor film directly formed on a surface of the chip, excitation-wavelength light is directly absorbed in the phosphor, which can advantageously mitigate degradation of efficiency due to the reflection or refraction by the phosphor.

However, even the structure with the phosphor film formed on the surface of the chip does not ensure effective light paths because of the dense structure of the phosphor film. Also, some portion of light reflected by the phosphor particles may be absorbed back into the LED chip, degrading light efficiency.

SUMMARY OF THE INVENTION

The present invention has been made to solve the foregoing problems of the prior art and therefore an object of certain embodiments of the present invention is to provide a method of forming a phosphor film which ensures effective light extraction paths using light-transmitting nano-beads, thereby capable of locally adjusting the refractive indices in the phosphor film.

Another object of certain embodiments of the invention is to provide a method of manufacturing a light emitting diode package having an improved light efficiency incorporating the method of manufacturing the phosphor film.

According to an aspect of the invention for realizing the object, there is provided a method of forming a phosphor film including steps of:

mixing phosphor and light-transmitting beads in an aqueous solvent such that the nano-sized light-transmitting beads having a first charge are adsorbed onto surfaces of phosphor particles having a second charge;

coating a phosphor mixture solution obtained from the mixing step on an area where the phosphor film is to be formed; and drying the coated phosphor mixture solution to form the phosphor film.

Preferably, the mixing step includes adding and mixing a dispersing agent having a first charge together with the phosphor and the light-transmitting beads.

The preferable conditions of the light-transmitting nano-beads may be defined in terms of diameter, thermal and optical characteristics. Each of the light-transmitting nano-beads may have a mean diameter of 50 nm to 500 nm and have a glass transition temperature of at least 100° C.

Each of the light-transmitting nano-beads may be one selected from a group consisting of polyethylene (PE), polypropylene (PP), polystyrene (PS), polyethylene terephtalate (PET), polyethylene napthalate (PEN), polybutylene terephtalate (PBT), polyethersulfone (PES), polyetherketone (PEEK), polycarbonate (PC), polyimide (PI), polyetherimide and polyacrylate or a combination thereof, which however does not limit the invention.

According to an embodiment of the invention, the phosphor particles have a positive charge, and each of the light-transmitting nano-beads has a functional group having a negative charge on a surface thereof, selected from a group consisting of sulfonates, phosphates and carboxylates.

For the phosphor mixture solution used in the invention, it is preferable that the phosphor comprises 2 wt % to 10 wt % of the aqueous solvent and the light-transmitting nano-beads comprises 5 wt % to 10 wt % with respect to the weight of the phosphor mixed. The aqueous solvent may be deionized water or alcohol in the invention.

According to another aspect of the invention for realizing the object, there is provided a method of manufacturing a light emitting diode package, comprising steps of:

mixing phosphor and light-transmitting beads in an aqueous solvent such that the nano-sized light-transmitting beads having a first charge are adsorbed onto surfaces of the phosphor particles having a second charge;

coating a phosphor mixture obtained from the mixing step on at least a light emitting surface portion of a light emitting diode chip;

drying the coated phosphor mixture to form a phosphor film; and forming a resin part on the light emitting diode chip with the phosphor film formed thereon.

Here, it is preferable that the light-transmitting nano-beads has a refractive index higher than that of the light emitting diode and lower than that of the resin part.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 1:
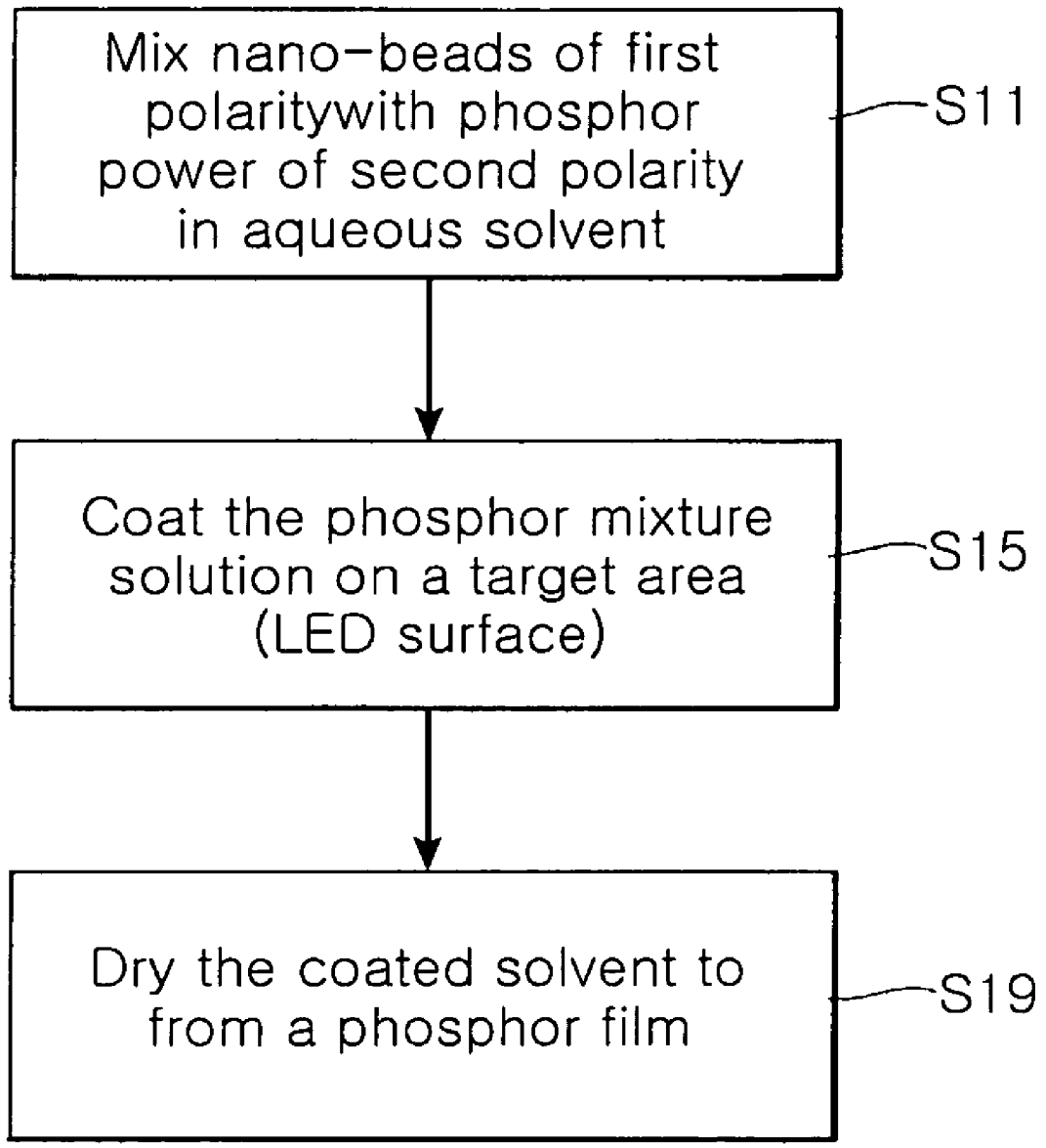
FIG. 1 is a flow chart showing a method of forming a phosphor film according to the present invention.

FIG. 1 is a flow chart showing a method of forming a phosphor film according to the present invention.

The method of forming a phosphor film according to the present invention starts with a step S11 of mixing phosphor and nano-sized light-transmitting beads in an aqueous solvent. In this step S11, the nano-beads have an opposite charge from the phosphor so that they can be adsorbed onto surfaces of the phosphor particles. For example, phosphor particles of for example, TAG and YAG may have a positive charge, and the light-transmitting nano-beads may have a functional group, having a negative charge on surfaces thereof, selected from a group consisting of sulfonates, phosphates and carboxylates. The aqueous solvent may be a solution such as deionized water and alcohol which does not incur unfavorable chemical reactions with the nano-beads and the phosphor while serving to facilitate mixing with its low viscosity. Preferably, a dispersing agent having a negative charge may be added in an appropriate amount to facilitate uniform mixing of the phosphor and the light-transmitting beads.

The nano-beads are transparent spherical particles which not only provide optical paths between the phosphor particles but also can adjust the propagation direction of light. The plurality of nano-beads are dangling-bonded to particle surfaces of the phosphor in the mixing process, and the functional group of each of the nano-beads can prevent degradation of light efficiency of the phosphor.

In addition, it is preferable that the phosphor is mixed in an amount of 2 to 10 wt % in the aqueous solvent for effective mixing and to form a uniform film. It is also preferable that the light-transmitting nano-beads are mixed in an amount of 5 to 10 wt % with respect to the weight of the phosphor mixed in order for proper adsorption of phosphor particles.

In the next step S15, a phosphor mixture solution obtained from the mixing step S11 is coated on an area where the phosphor film is to be formed. Having low viscosity, the phosphor-containing mixture solution may be dropped to coat a specific area such as a surface of the LED chip. However, other generally-known processes such as printing or spraying can be adopted to coat a large area such as a display device.

Finally, in the step S19, the coated phosphor mixture solution is dried to form a phosphor film. During this process, solvent in the phosphor mixture solution is evaporated to form the phosphor film. With its low viscosity, the mixture solution can form a uniform thickness of film. The resultant phosphor film has a structure in which the pluralities of nano-beads are adsorbed onto surfaces of the phosphor particles.

Figure 2:
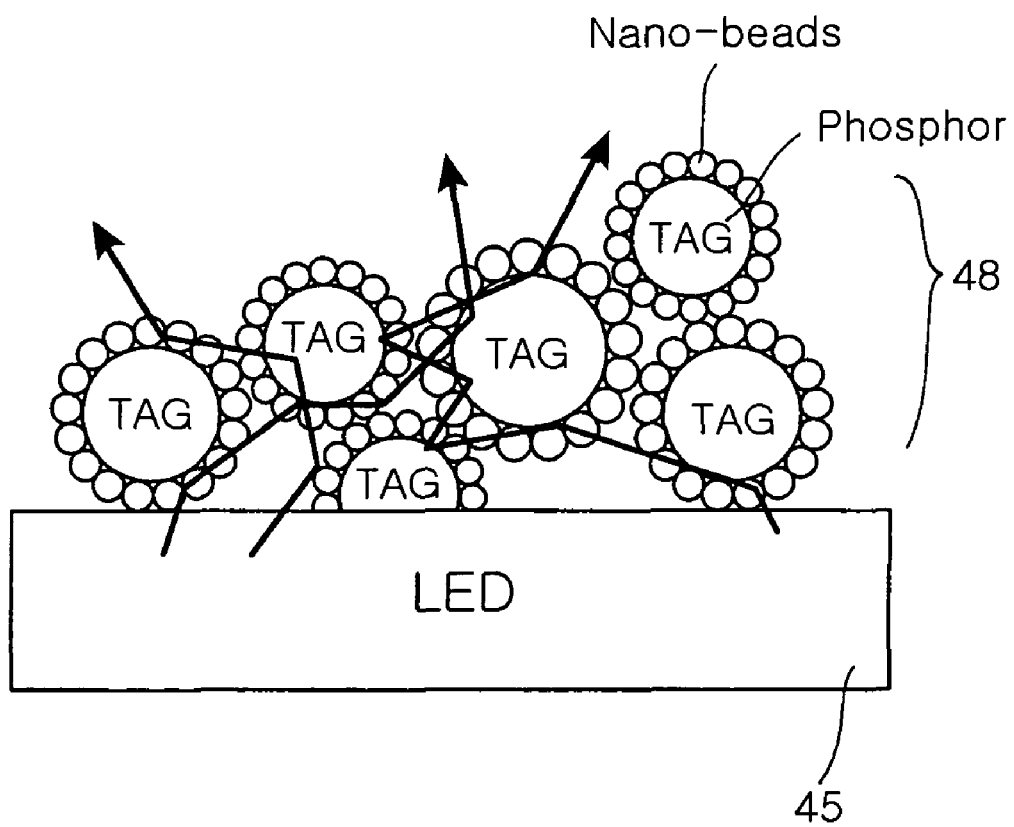
FIG. 2 is a schematic view illustrating the operation of nano-beads in the phosphor film formed according to the present invention.

FIG. 2 is a schematic view illustrating the operation of the nano-beads in the phosphor film formed according to the present invention.

FIG. 2 illustrates the phosphor film 48 formed on a surface of an LED chip 45. The light-transmitting nano-beads are adsorbed onto the surfaces of the phosphor particles by dangling bonding, and thus light paths are ensured by transparent nano-beads as indicated by the arrows in FIG. 2.

It is preferable that each of the light-transmitting nano-beads used in the invention has a mean diameter of 50 to 500 nm to facilitate adsorption of the phosphor particles as well as allow good optical effects. And since a light source acts as a heat source, it is preferable that each of the light-transmitting nano-beads has a glass transition temperature $T_g$ of at least 100° C.

The light-transmitting beads can be selected from, but not limited to, a group consisting of polyethylene (PE), polypropylene (PP), polystyrene (PS), polyethylene terephtalate (PET), polyethylene naphthalate (PEN), polybutylene terephtalate (PBT), polyethersulfone (PES), polyetherketone (PEEK), polycarbonate (PC), polyimide (PI), polyetherimide, polyacrylate or a combination thereof.

Figure 3:
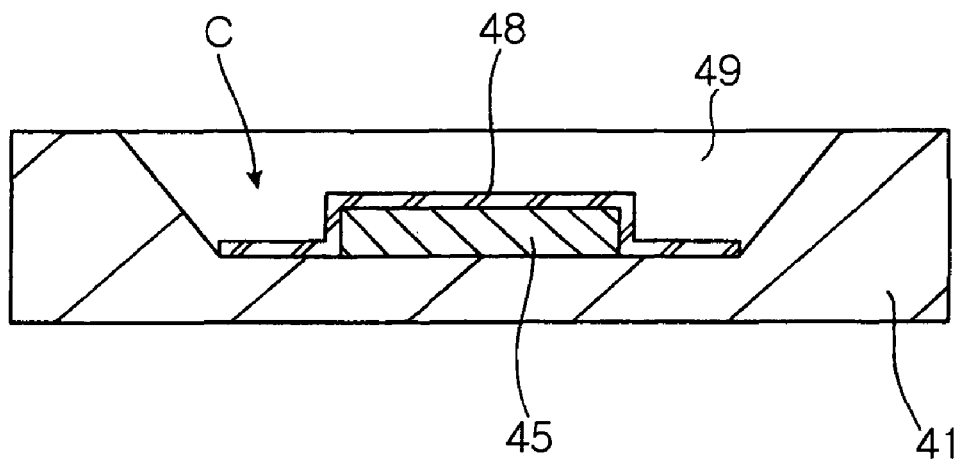
FIG. 3 is a schematic view illustrating a light emitting diode package with the phosphor film formed therein according to the present invention.

FIG. 3 is a schematic view illustrating a light emitting diode package with the phosphor film formed thereon.

The light emitting diode package 41 shown in FIG. 3 has the phosphor film 48 formed according to the method of the present invention. The light emitting diode chip 45 is mounted in a mounting area C of a package substrate 41 and the phosphor film 48 is formed on at least a light-emitting surface of the chip 45. After the phosphor film 48 is formed, a resin part 49 is formed using epoxy resin or silicone polymer resin.

In this case, the light-transmitting nano-beads adsorbed onto the surfaces of phosphor particles can be made of a material having a refractive index higher than that of a material constituting the light emitting diode chip and lower than that of the resin part. Thereby, the refractive indices are locally adjusted in the phosphor film to improve light extraction efficiency.

Now, the effects of the present invention will be examined in more detail with reference to specific examples.

Inventive Example 1

In this Example, a phosphor-containing mixture solution was prepared according to the method of the present invention. TAG phosphor having a positive (+) charge was used for the phosphor. Sulfonated-polystyrene beads, 10 wt % solution, commercially available from Sigma Aldrich, each having a mean particle size of 300 nm were used for the light-transmitting nano-beads (see FIG. 3). In addition, poly (acrylamide-co-acrylic acid) partial sodium salt having a negative (−) charge was used for the dispersing agent.

First, a phosphor solution (TAG:water=1:17) containing the TAG phosphor was prepared. And 100 µl of polystyrene nano-beads solution was extracted and diluted by ten times to prepare a nano-beads solution. 3 ml of the phosphor solution and 100 µl of the nano-beads solution were mixed in deionized water with a small amount of the dispersing agent, using a vortex mixer.

Figure 5:
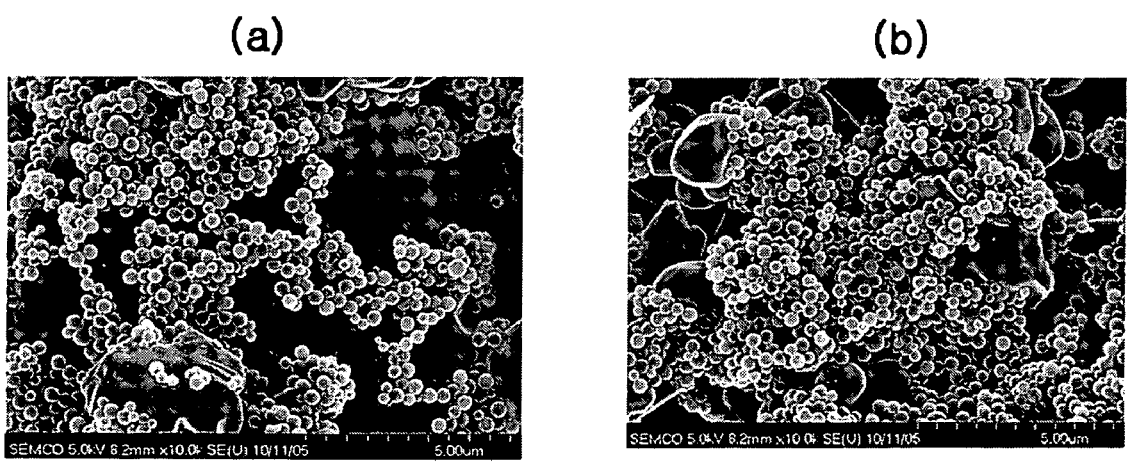
FIGS. 5a and 5b are SEM pictures showing phosphor particles with nano-beads adsorbed thereon before and after drying (phosphor mixture and phosphor film) according to an embodiment of the present invention.

FIG. 5a confirms that the nano-beads are adsorbed onto surfaces of the phosphor particles in the phosphor mixture solution after they are completely mixed.

Of the phosphor mixture solution fabricated according to this Example, about 10 to 15 µl is extracted with a micro pipet, dropped on a surface of the LED chip mounted on a substrate package, and dried for 7 to 8 minutes at 50 to 60° C. to form a phosphor film. FIG. 5b is an SEM picture showing the phosphor film after it is dried. As shown in FIG. 5b, the pluralities of spherical nano-beads remain adsorbed onto surfaces of the phosphor particles.

Figure 4:
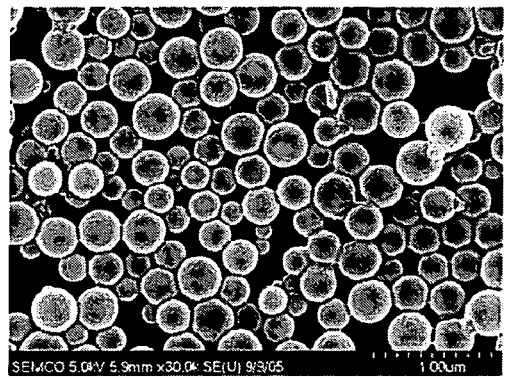
FIG. 4 is a Scanning Electron Microscope (SEM) picture of polystyrene nano-beads adopted in an embodiment of the present invention.

Then, as shown in FIG. 4, a resin part was formed using a silicone polymer resin.

Inventive Example 2

In this Example, a phosphor film and a light emitting diode package having a resin part was fabricated under the same conditions and through the same processes as in above-described Example 1. However, half the amount of the nano-beads solution (100 µl) used in Example 1, 50 µl, was used to form the phosphor film.

Comparative Example 1

In this experiment, a phosphor film and a light emitting diode package having a resin part were fabricated under the same conditions and through the same processes as in Example 1. However, the phosphor mixture solution containing the nano-beads solution, which was neutral (pH=7) in two previous Inventive Examples, was adjusted to have a pH of about 9.5 in this Comparative Example.

Comparative Example 2

In this Comparative Example, without the light-transmitting nano-beads, only the TAG phosphor and the dispersing agent were mixed under the same conditions as in Inventive Examples to prepare a conventional phosphor mixture solution. About 10 to 15 µl was extracted with a micro pipet from the phosphor mixture solution, dropped on a surface of an LED chip mounted on a package substrate, and dried for 7 to 8 minutes at about 50 to 60° C. Finally, a resin part was formed using a silicone polymer resin.

Figure 6:
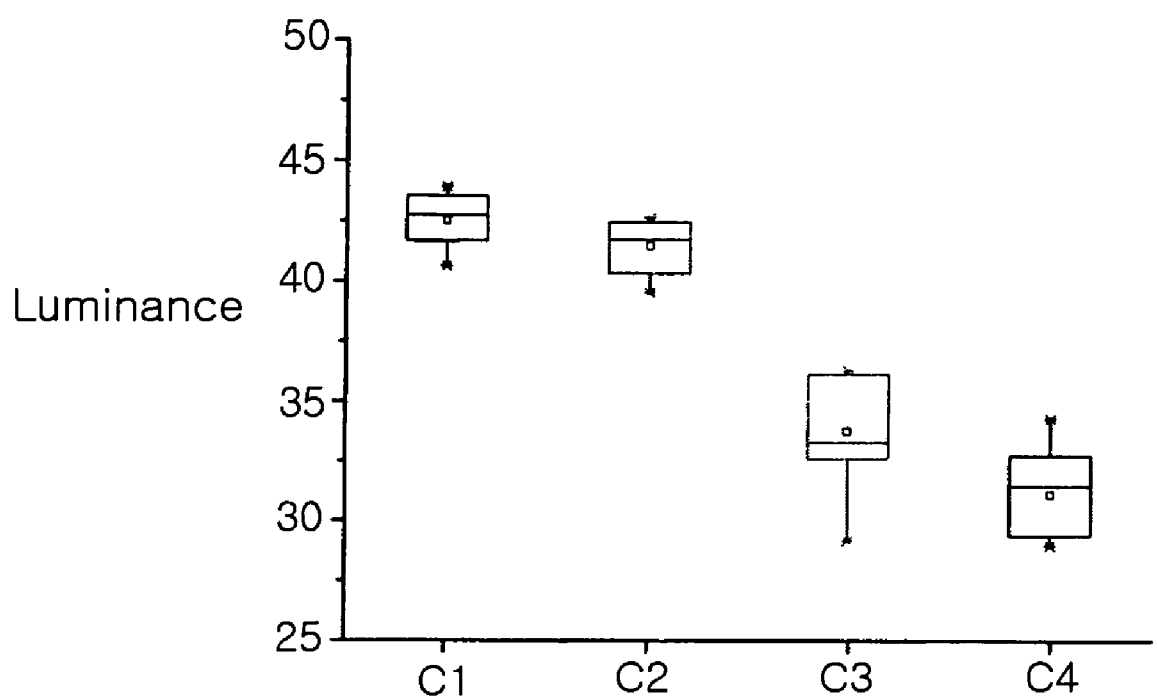
FIG. 6 is a graph illustrating luminance enhancement effect of a light emitting diode package manufactured according to an embodiment of the present invention.

The luminance of each of the light emitting diode package obtained from Examples 1 and 2 according to the present invention and Comparative Examples 1 and 2 according to the prior art was measured. In FIG. 6, the graph shows that the light emitting diode packages according to Example 1 and 2 (C1 and C2) have luminance improved from those according to Comparative Examples 1 and 2 (C3 and C4).

With reference to FIG. 6, in Comparative Example 1 (C3), although the sulfonated polystyrene beads were used under the same conditions as in Example 2, the phosphor mixture solution was made with the higher pH, causing the H ions to break away from the sulphonates and hindering the beads from taking a desired negative (−) charge. Thus, the polystyrene beads were hardly adsorbed onto surfaces of the phosphor in Comparative Example 1. Therefore, Comparative Example 1 yielded the similar level of luminance as Comparative Example 2.

On the contrary, the LED packages obtained from Examples 1 and 2 (C1 and C2) show about 9 to 11 lm increase from those in Comparative Examples 1 and 2 (C3 and C4), exhibiting about 30% improvement in luminance. Therefore, the luminance of the LED was significantly improved by adsorbing the nano-beads having an opposite charge from the phosphor onto surfaces of the phosphor.

In addition, as confirmed in Comparative Example 1, certain conditions (pH, etc.) for allowing the nano-beads to include an operation group having a specific electric charge such as sulphonate and carboxyl should be considered since it is important that the nano-beads are not simply mixed but adsorbed onto the surfaces of the phosphor particles. These conditions can be set differently according to the material used.

This can be understood that the light-transmitting nano-beads adsorbed on the surface of the phosphor particles provide paths for the light extracted from the LED chip. In addition, the silicone polymer resin has a refractive index of about 1.5, and the polystyrene nano-beads adopted in the invention have a refractive index of 1.59, thus indicating that the refractive indices were locally increased in the phosphor film, thereby improving light extraction effects.

According to the present invention set forth above, light-transmitting nano-beads having a different functional group from phosphor are adsorbed on surfaces of the phosphor particles, ensuring effective light paths at a dense phosphor film. Further, nano-beads having an appropriate refractive index were used to locally increase the refractive indices in a phosphor film, thereby increasing light extraction efficiency.

While the present invention has been shown and described in connection with the preferred embodiments, it will be apparent to those skilled in the art that modifications and variations can be made without departing from the spirit and scope of the invention as defined by the appended claims.

What is claimed is:

1. A method of forming a phosphor film comprising steps of:
    mixing phosphor and nano-sized light-transmitting beads in an aqueous solvent such that the nano-sized light-transmitting beads having a first charge are adsorbed onto surfaces of phosphor particles having a second charge;
    coating a phosphor mixture obtained from the mixing step on an area where the phosphor film is to be formed; and
    drying the coated phosphor mixture to form the phosphor film,
    wherein the phosphor particles have a positive polarity, and each of the light-transmitting nano-beads has a functional group having a negative polarity on a surface thereof, selected from the group consisting of sulfonates, phosphates and carboxylates.

2. The method according to claim 1, wherein the mixing step comprises adding and mixing a dispersing agent having a negative polarity together with the phosphor and the light-transmitting beads.

3. The method according to claim 1, wherein each of the light-transmitting nano-beads has a mean diameter of 50 nm to 500 nm.

4. The method according to claim 1, wherein the light-transmitting nano-beads have a glass transition temperature of at least 100° C.

5. The method according to claim 1, wherein each of the light-transmitting nano-beads comprises one selected from the group consisting of polyethylene (PE), polypropylene (PP), polystyrene (PS), polyethylene terephthalate (PET), polyethylene naphthalate (PEN), polybutelene terephtalate (PBT), polyethersulfone (PES), polyetherketone (PEEK), polycarbonate (PC), polyimide (PI), polyetherimide and polyacrylate.

6. The method according to claim 1, wherein the phosphor comprises 2 wt % to 10 wt % of the aqueous solvent.

7. The method according to claim 1 or 6, wherein the light-transmitting nano-beads comprise 5 wt % to 10 wt % with respect to the weight of the phosphor in the phosphor mixture.

8. The method according to claim 1, wherein the aqueous solvent comprises deionized water or alcohol.

9. A method of manufacturing a light emitting diode package, comprising steps of
    mixing phosphor and nano-sized light-transmitting beads in an aqueous solvent such that the nano-sized light-transmitting beads having a first charge are adsorbed onto surfaces of the phosphor particles having a second charge;

coating a phosphor mixture obtained from the mixing step on at least a light emitting surface portion of a light emitting diode chip;

drying the coated phosphor mixture to form a phosphor film; and forming a resin part on the light emitting diode chip with the phosphor film formed thereon, wherein the phosphor particles have a positive polarity, and the each of the light-transmitting nano-beads has a functional group having a negative polarity selected from the group consisting of sulfonates, phosphates and carboxylates on a surface thereof.

10. The method according to claim 9, wherein the mixing step comprises adding and mixing a dispersing agent having a negative polarity together with the phosphor and the light-transmitting beads.

11. The method according to claim 9, wherein each of the light-transmitting nano-beads has a mean diameter of 50 to 50 nm.

12. The method according to claim 9, wherein each of the light-transmitting nano-beads has a glass transition temperature of at least 100° C.

13. The method according to claim 9, wherein the light-transmitting nano-beads has a refractive index higher than that of the light emitting diode and lower than that of the resin part.

14. The method according to claim 9, wherein each of the light-transmitting nano-beads comprises one selected from the group consisting of polyethylene (PE), polypropylene (PP), polystyrene (PS), polyethylene terephthalate (PET), polyethylene naphthalate (PEN), polybutelene terephtalate (PBT), polyethersulfone (PES), polyetherketone (PEEK), polycarbonate (PC), polyimide (PI), polyetherimide and polyacrylate.

15. The method according to claim 9, wherein the phosphor is mixed in the amount of 2 wt % to 20 wt % of the aqueous solvent.

16. The method according to claim 9 or 15, wherein the light-transmitting nano-beads are mixed in the amount of 5 wt % to 40 wt % with respect to the weight of the phosphor in the phosphor mixture.

17. The method according to claim 9, wherein the aqueous solvent comprises deionized water or alcohol.

* * * * *